US010054426B2

United States Patent
Hetzler et al.

(10) Patent No.: US 10,054,426 B2
(45) Date of Patent: Aug. 21, 2018

(54) MASK INSPECTION SYSTEM FOR INSPECTING LITHOGRAPHY MASKS

(71) Applicant: Carl Zeiss SMT GmbH, Oberkochen (DE)

(72) Inventors: Jochen Hetzler, Aalen (DE); Joachim Schroeder, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 383 days.

(21) Appl. No.: 14/920,933

(22) Filed: Oct. 23, 2015

(65) Prior Publication Data

US 2016/0123724 A1    May 5, 2016

(30) Foreign Application Priority Data

Oct. 31, 2014 (DE) .......................... 10 2014 222 271

(51) Int. Cl.
| | |
|---|---|
| *G01B 11/14* | (2006.01) |
| *G01B 11/24* | (2006.01) |
| *G03F 1/84* | (2012.01) |

(52) U.S. Cl.
CPC .............. *G01B 11/14* (2013.01); *G01B 11/24* (2013.01); *G03F 1/84* (2013.01)

(58) Field of Classification Search
CPC ......... G01B 11/14; G01B 11/24; G01B 11/02; G01B 11/026; G01B 11/03; G03F 1/84
USPC ......................................................... 356/614
See application file for complete search history.

(56) References Cited

U.S. PATENT DOCUMENTS

| | | | |
|---|---|---|---|
| 6,226,087 B1 | 5/2001 | Blaesing-Bangert | |
| 6,542,251 B2* | 4/2003 | Mueller-Rentz | ..... G01B 11/002 |
| | | | 356/399 |
| 8,305,587 B2 | 11/2012 | Heiden | |
| 2003/0095252 A1* | 5/2003 | Mainberger | ....... G01N 21/9501 |
| | | | 356/237.2 |

FOREIGN PATENT DOCUMENTS

| | | | |
|---|---|---|---|
| DE | 198 17 714 | 11/1999 | ............. G01B 11/00 |
| DE | 10 2008 037 465 | 4/2010 | ............. G01B 11/03 |
| DE | 10 2009 044 294 | 5/2011 | ............. G01B 11/03 |

OTHER PUBLICATIONS

German Office Action for German Application No. 10 2014 222 271.0 dated Jan. 21, 2016 (10 pages).

* cited by examiner

*Primary Examiner* — Hina F Ayub
*Assistant Examiner* — Amanda Merlino
(74) *Attorney, Agent, or Firm* — Fish & Richardson P.C.

(57) ABSTRACT

One aspect of the present invention relates to a mask inspection system for inspecting lithography masks, including a placement table for placing a lithography mask to be inspected, a first optical unit with a first beam path for examining structures of the lithography mask, and a second optical unit with a second beam path for establishing a position of at least one edge of the lithography mask. Here, the second beam path of the second optical unit passes at least once through a plane defined by the placement table.

31 Claims, 6 Drawing Sheets

MASK INSPECTION SYSTEM FOR INSPECTING LITHOGRAPHY MASKS

CROSS-REFERENCE TO RELATED APPLICATION

This application claims priority to German application 10 2014 222 271.0, filed on Oct. 31, 2014, the entire contents of which are hereby incorporated by reference.

TECHNICAL FIELD

The present invention relates to a mask inspection system for inspecting lithography masks.

BACKGROUND

In the semiconductor industry, optical inspection systems which, e.g., measure the position of mask structures or so-called "registration marks" on a lithography mask are used to measure lithography masks. This can be implemented with an accuracy in the nanometer range, but only specifies the position of the structures relative to one another.

A further object of inspection systems consists of establishing the position of these structures or marks relative to the edges of the lithography mask. This is referred to as edge detection or "mask edge detection." Here, for example, an accuracy of the order of 10 µm is sought after.

A problem occurring when detecting the edges consists of the fact that, when using the optical system provided for measuring the mask structures, this edge cannot be measured directly since lithography masks usually have chamfers, i.e., angled edges. Consequently, the actual edge of the lithography mask no longer lies in the depth of field of the optical unit and refocusing is often not possible for installation space reasons. For conventional dimensions of the chamfers and when a conventional imaging optical unit for inspecting mask structures is used, an edge unsharpness of the order of several hundred µm is to be expected.

In order to get a handle on this problem, e.g., DE 198 17 714 C5 discloses a method for measuring structures on a mask surface, which method comprises the measurement of a coordinate position of two outer edges of the mask perpendicular to one another. To this end, use is made of an imaging optical unit with a small aperture. Here, the measuring table surface has a reflecting embodiment for the imaging rays of the measuring instrument, at least in the region of the outer edges of the mask placed thereupon, as a result of which the edge is illuminated in the reflected light.

However, the disadvantage of this method is that the surface of the measuring table must be processed in order to make it reflective. By way of example, if masks with different dimensions are intended to be examined, it is necessary to ensure that the employed measuring table is reflective at the edge of the mask to be measured in each case. If, furthermore, it is not intended for the whole table to have a reflecting configuration, for example in order to minimize stray light which could adversely affect the structure measurements, the reflecting regions of the measuring table should be adapted individually for each mask size. In any case, this procedure is laborious and time-consuming.

SUMMARY

In one aspect of the invention, a mask inspection system for inspecting lithography masks is provided. The mask inspection system enables an edge detection in the sought-after accuracy range, and is adaptable for lithography masks with different dimensions without requiring a laborious and time-consuming reconstruction of the system. Moreover, the mask inspection system requires little installation space and the number of optical components that is required is small. Moreover, edges can be detected in a quick and easy manner.

In another aspect of the invention, a mask inspection system for inspecting lithography masks comprises a placement table for placing a lithography mask to be inspected, a first optical unit with a first beam path for examining structures of the lithography mask, and a second optical unit with a second beam path for establishing a position of at least one edge of the lithography mask. Here, the second beam path of the second optical unit passes at least once through a plane defined by the placement table.

In this case, using a first beam path for examining the structures and a second beam path for edge detection renders it possible to construct and adapt the respective beam path by optical elements in such a way that the examination of the structures or the edge detection with the mask inspection system meets the respective accuracy requirements, without this requiring laborious and time-consuming reconstruction measures.

The totality of all elements serving to influence the respective beam path are considered to be the first and second optical unit, together with the associated light sources, recording cameras or screens, etc. The respective optical unit can comprise one or more optical subunits, for example an illumination optical unit and/or an imaging optical unit. Each of these optical subunits in turn can comprise one or more optical elements. Here, an optical element can be understood to mean, firstly, an individual optical component, such as, e.g., a mirror, a lens element, a stop, etc. However, a combination of such individual optical components to form a building unit, for example a lens or condenser with a lens-element system and possibly one or more stops, etc., can also be understood to mean an optical element.

The fact that the mask inspection system comprises a first optical unit and a second optical unit can mean, in particular, that the first optical unit and the second optical unit do not correspond completely in terms of all constituents and components. Thus, it is possible that there are one or more optical elements, which in each case only belong to one of the two optical units. For example, the first optical unit and the second optical unit can each have a separate light source and/or a separate camera for recording the images to be examined and/or other separate optical elements. This can render it possible to adapt the respective optical unit particularly accurately to the respective requirements.

In particular, the mask inspection system according to the invention enables an illumination of the edge through the placement table such that there is no need for reflecting, at the placement table, the radiation used for the edge detection. Here, for example, the edge can be illuminated in the transmitted-light mode, i.e., directly through the placement table. However, a reflected-light mode, in which the edge is, e.g., first of all directly illuminated from the mask side of the placement table in order then, after the return reflection of the radiation at a side of the placement table facing away from the mask, to illuminate the edge again from the table side is also possible. What is advantageous here is that such a placement table is therefore often already transmissive to radiation because examining the structures of the lithography masks is provided in the transmitted-light mode. Thus, in such a case, there is no need for any or any significant adaptation of the placement table.

The mask inspection system according to the invention enables a targeted and accurately controllable illumination of the edge of the lithography mask "from below," as a result of which disadvantageous effects, such as, e.g., the lack of depth of field of the imaging optical unit, can be softened during the edge detection. Consequently, the accuracy of the edge detection can be improved.

By way of example, the first optical unit can use radiation with a first wavelength in the ultraviolet spectral range, in particular radiation with a first wavelength in the range from 193 nm to 365 nm.

As a result of using radiation in the ultra-violet (UV) range, in particular in the range from 193 nm to 365 nm, it is possible also to resolve structures of the lithography mask in the nanometer range, as may be desirable or even required these days given the packing density of the structures on lithography masks.

The second optical unit can use radiation with a second wavelength, which differs from the first wavelength.

By using various types of radiation for the first optical unit and the second optical unit, it may be possible, for example, to use common optical elements, such as, e.g., lens elements or lens-element systems, for both optical units, said common optical elements however having a different influence on the different types of radiation, for example different refraction or reflection properties. As a result of this, different beam paths can be realized with the commonly used optical elements for the two optical units. This may be more cost effective than the use of completely separate optical elements for the first and the second optical units and can moreover save installation space.

By way of example, the second optical unit can use radiation with a second wavelength in the range from 300 nm to 800 nm, in particular radiation with a second wavelength in the visible spectral range.

Since an accuracy which lies below the desired accuracy for the examination of the structures of the lithography mask may also be sufficient for the edge detection, for example an accuracy in the region of ≈10 μm, use can be made here of radiation with a longer wavelength. An advantage of optically visible radiation is, furthermore, that it renders it possible to easily understand and adjust the second beam path. Also, due to the visibility, there is a lower risk of injury than when using invisible UV radiation—which moreover has higher energy levels—e.g., as result of stray light, which could reach the eye of a user during the adjustment of the mask inspection system.

Moreover, it is possible for the second optical unit to image an image field with an extent of more than 100 μm in at least one direction, in particular an image field with an area greater than 100 μm times 100 μm.

Imaging such a possibly enlarged image field compared to the image field of the first optical unit renders it possible to find the position of the edge of the lithography mask more quickly. Since, as already mentioned above, achieving accuracy of the order of a few μm is typically sufficient when determining the position of the edge, such a larger image field can, for example, be imaged by virtue of an imaging optical unit of the second optical unit providing a smaller magnification than a corresponding imaging optical unit of the first optical unit. Here, in general, an imaging optical unit is understood to mean that part of the first or second optical unit which images the structures of the lithography mask or the edge thereof for evaluation purposes, e.g., on the sensor of a (charged coupled device (CCD)) camera.

The first optical unit and the second optical unit can have at least one common optical element.

As already mentioned previously, an optical element can be understood to mean, firstly, an individual optical component, such as, e.g., a mirror, a lens element, a stop, etc. However, a combination of such individual optical components to form a building unit, for example a lens or condenser, etc., can also be understood to mean an optical element.

By using one or more common optical elements for the first and second optical unit, the design of the mask inspection system can be simplified and installation space and costs can be saved. Also, it may be the case that fewer optical elements need to be adjusted than in the case where the first and the second optical unit are constructed from completely separate optical elements.

By way of example, the at least one common optical element can comprise a common lens, in particular a common lens with a numerical aperture NA≥0.6.

As a result of a common lens with a numerical aperture in this range, it is possible to achieve a particularly good resolution and a high light intensity when imaging the structures of the lithography mask, and so accuracies in the nm range are obtainable when examining the structures of the lithography mask. Moreover, such a lens can also be well-suited to edge detection. Optionally, the numerical aperture of the common lens can be reduced when used for the edge detection, for example by a stop or the like, in order thus to increase the depth of field of the image and increase the accuracy of the edge detection. Therefore, it may be possible to use a common lens without needing to make noticeable compromises in relation to the accuracy to be achieved when examining the structure and/or detecting edges.

By way of example, the common lens can be focussed onto a focal area which substantially coincides with a surface of the lithography mask facing the lens. By way of example, in this case substantially can mean the extent to which the focusing can be set accurately as a result of mechanical limitations.

By way of example, for reasons of installation space or for accelerating the inspection method, it may be advantageous to use a lens which does not enable refocusing. Or, for example, refocusing is only permitted within the range of the bending of the lithography mask.

By way of example, the first optical unit can be focussed by displacing the placement table (e.g., in the vertical direction) and not by displacing or refocusing the lens. This may render it possible to use the placement table to adjust both for different thicknesses of the lithography mask (which may be caused by production tolerances) and for the bending of the lithography mask (which, for example, may lie in the region of ≈1 μm). Moreover, there can be matching of the focusing of the second optical unit to the focusing of the first optical unit, for example once by displacing a recording camera of the second optical unit, such that both optical units can image the same area or plane (e.g., the aforementioned focal area) in focus. Then, by the displacement thereof, the placement table can equally "focus" the first optical unit and the second optical unit.

Since the structures of the lithography mask to be inspected are often arranged on or near a surface of the lithography mask, a high resolution can be achieved when examining the structures despite such fixed, or approximately fixed, focusing in the case of a corresponding placement of the lithography mask (in such a way that the structures face the lens). However, naturally, the common lens can also be focused onto the focal area described here when large-scale refocusing is possible.

As already mentioned, the common lens is also usable as part of the second optical unit when establishing the position of the edge of the lithography mask, possibly with a reduced numerical aperture in order to increase the depth of field. In the process, the same focusing of the common lens can be used, as just described.

Consequently, as a result of using the common lens as part of both the first and the second optical unit, it is possible to save installation space and costs and the mask inspection system can have a less complex configuration in terms of the design thereof. To the extent that no, or only restricted, refocusing of the common lens is possible, the latter is preferably focused on the above-described focal area since a higher resolution is often wanted or necessary when examining the structures of the lithography mask than when detecting the edge.

The at least one common optical element can furthermore comprise a common illumination element, which enables the illumination of the structures of the lithography mask for the examination thereof and the illumination of the edge for establishing the position of the edge.

A common illumination element can serve to reduce installation space and costs even further and to reduce the number of the optical elements to be adjusted. Hence, it is also possible to reduce the number of possible error sources in the mask inspection system.

By way of example, the common illumination element can comprise a common condenser.

Within the scope of the first optical unit, the common illumination element can serve to increase the illumination strength of the illumination of the structures of the lithography mask and therefore increase the light intensity available for examining the structures of the lithography mask. Suitable to this end is a condenser configured to introduce into the imaging beam path of the imaging optical unit of the first optical unit a portion that is as large as possible of the radiation emanating from a radiation source. Within the scope of the second optical unit, the common illumination element can serve to illuminate the edge, wherein the illumination can be implemented in such a way that an edge detection in the desired accuracy range is made possible.

By way of example, the illumination of the structures of the lithography mask within the scope of the first optical unit is brought about in the transmitted-light mode through the placement table and, in particular, through the mask. This enables an examination of the structures of the lithography mask independently of the reflection properties of the mask surface and can have a simple configuration in terms of design and can be implemented in a cost-effective manner. By way of example, expensive reflection elements for UV radiation can be dispensed with to a great extent.

In one embodiment of the mask inspection system, the second beam path of the second optical unit emanates from a first half space, which is delimited by the plane defined by the placement table and in which the lithography mask is not situated, and passes through the plane from there.

Here, the second beam path of the second optical unit can extend at least in part next to the lithography mask. What this can render possible is that the light contributing to the imaging does not pass through, or only partly passes through, the lithography mask.

Thus, the second optical unit can also be operated in the transmitted-light mode. Particularly in conjunction with a first optical unit operated in the transmitted-light mode, this can enable a configuration of the mask inspection system which is very compact and in which the first optical unit and the second optical unit can share various common optical elements such that the overall number of different components can be reduced. By way of example, this can save costs and reduce susceptibility to errors.

By way of example, a light source for the second optical unit can comprise an end of an optical waveguide. This applies not only to the transmitted-light mode of the second optical unit described here, but in general to all embodiments of the present invention, thus in particular also to the reflected-light mode of the second optical unit described further below.

By way of example, an advantage of such an optical waveguide, e.g., an optical fiber, is that the end thereof can approximately constitute a point source such that the beam path emanating from the optical waveguide can be controlled and influenced very precisely by optical elements. Moreover, light can easily be introduced into the mask inspection system at the desired point with the aid of such an optical waveguide, without this requiring complicated shielding measures in order to shield other parts from possible stray light.

In particular, it is possible for the second optical unit to comprise an illumination optical unit for illuminating the edge of the lithography mask, wherein the illumination of the edge is implemented by use of a parallel or converging illumination beam. Here, for example, the illumination beam can converge to the focal area of the lens (or to the plane defined by the placement table) and have a half aperture angle $\alpha$ with $n*\sin \alpha \leq 0.1$. By way of example, n can denote a refractive index of a medium which is situated between the edge and the illumination optical unit or which pervades the mask inspection system.

Analogous to the numerical aperture of the lens already mentioned above, which is also referred to as imaging NA, the variable $n*\sin \alpha$ specified here is often also referred to as illumination NA.

The illumination optical unit of the second optical unit can serve, firstly, to illuminate the edge to be detected with a sufficient illumination intensity in order to enable good imaging and detecting. By way of example, a condenser can serve to this end. In conjunction with a common lens of the first and second optical units and, in particular, if said lens is focused on the above-described focal area, it can be furthermore advantageous if the illumination beam is configured to be parallel or converge towards the focal area of the common lens and have a small half aperture angle (with a small illumination NA).

The reason for this is that, as a result of the chamfer of the lithography mask, the edge to be detected often lies outside the focal region of the lens such that the edge may not lie in the region of the depth of field of the lens.

By way of example, in order to reduce the unsharpness, use can be made of a small illumination NA and/or a small imaging NA. The resultant unsharpness can then be characterized by the minimum of illumination NA and imaging NA. These considerations apply, in particular, when diffraction effects at the edge or the chamfer of the lithography mask are negligible. By way of example, diffraction effects can be described by Fresnel diffraction at the edge and these limit the sharpness which one could expect from a simple cast shadow.

Furthermore, in principle, it should be noted that it may be possible for the final determination of the position of the edge to be more accurate than the unsharpness on the imaged image of the edge. By way of example, this can be achieved by using suitable image processing methods which may therefore further support the improvement in the accuracy of the edge detection.

Furthermore, it is advantageous if the illumination optical unit of the second optical unit comprises the common illumination element. In particular, the illumination optical unit of the second optical unit may comprise the common condenser.

As a result of this, it is possible to combine the advantageous effects, which were already mentioned above, of these embodiment options. In particular, the common condenser can serve to guide the illumination beam in the direction of the focal plane, as described above.

By way of example, it is possible for the illumination optical unit of the second optical unit to image the end of the optical waveguide in a plane of a stop of the common condenser. In principle, this option also exists when using a separate condenser for the second optical unit only.

As a result of this, it is possible to generate an almost punctiform image of the end of the optical waveguide in the stop plane of the condenser (depending on the imaging scale of the image) such that the radiation emerging from the condenser can be influenced particularly accurately in terms of the light path thereof. In particular, this can render it possible to achieve the aforementioned small half aperture angle of the illumination beam or a parallel illumination beam and thus promote a sharp shadow of the edge of the lithography mask being cast.

By way of example, the mask inspection system can furthermore comprise at least one colour beam splitter and/or a movable mirror.

By way of example, such optical elements can serve for switching between illuminating the structures and illuminating the edge of the lithography mask, without this requiring any reconstruction of the mask inspection system, even in the case where the first and second optical unit have one or more common optical elements. However, a color beam splitter can also separate the first and second beam path in order to respectively guide these through separate optical elements, or to reunite these after passing through such separate beam paths.

In a further embodiment of the mask inspection system, the second beam path of the second optical unit emanates from a second half space, which is delimited by the plane defined by the placement table and in which the lithography mask is situated, passes through the plane from there and is subsequently reflected back at a reflection area of a reflection element in a first half space, which is likewise delimited by the plane and in which the lithography mask is not situated.

As a result of the arrangement in the reflected-light mode, selected here, for the second optical unit, it is possible, for example, to save installation space on the side of the placement table facing away from the mask.

By way of example, the reflection element can image the focal area of the common lens onto itself, preferably with an imaging scale $\beta$ with $0.9<|\beta|<1.1$.

In the reflected-light mode of the edge detection described here, the common lens can assume a dual function within the second optical unit: it can firstly serve to illuminate the edge "from above" and it can furthermore serve to image the image of the edge on, e.g., the sensor of a (CCD) camera. As a result of imaging the focal area of the common lens onto itself, the disadvantageous effects from the lack of depth of field on the accuracy of the edge detection can be reduced by virtue of it being possible to cast a sharp shadow of the edge of the lithography mask into the focal area. Preferably, the size ratios are also approximately maintained, and so a detection of the position of the edge true to scale may be possible.

Here, reference is made to the fact that such imaging by the reflection element, in which a focal area substantially coinciding with the surface of the lithography mask is imaged on itself (true to scale), is also feasible if the first and second optical units do not use a common lens.

By way of example, the second optical unit can comprise an aperture stop, which defines at least one chief ray and at least one marginal ray, and the reflection element can be arranged in the second beam path of the second optical unit in such a way that (i) a chief ray height at the reflection area is equal to 0 and the marginal ray is substantially perpendicular to the reflection area or (ii) the chief ray is substantially perpendicular to the reflection area and a marginal ray height at the reflection area is equal to 0.

If the reflection element satisfies one of the two conditions above, it can enable largely distortion-free and true to scale imaging of the focal area of the common lens onto itself and hence enable a detection of the edge with the desired accuracy.

By way of example, the reflection area can be embodied by an at least partly reflecting area of the common illumination element, in particular by an at least partly reflecting area of a lens-element system of the common condenser.

By using the common illumination element, in particular the common condenser, for providing the at least partly reflecting area, it is possible to save additional optical components, which may save installation space and costs. In this case, the partly reflecting area is preferably strongly reflecting for the radiation used in the second optical unit while it is not reflecting or only weakly reflecting for the radiation used in the first optical unit so as not to attenuate too strongly the illumination of the structures with the aid of the common illumination element.

Here, the at least partly reflecting area of the common illumination element, in particular the at least partly reflecting area of the lens-element system of the common condenser, can have a coating for increasing a reflectivity of the area in the visible spectral range.

As already mentioned previously, radiation in the visible range is preferably used for the second optical unit. Particularly when using UV radiation for the first optical unit, this presents the option of coating the partly reflecting area with one or more materials which strongly reflect visible light but are strongly transmissive for UV radiation. Such materials are commercially available and can easily be applied, without the imaging properties of the first illumination element in respect of UV radiation being markedly changed in the process. By way of example, it would be conceivable for such coatings to consist of several layers of different materials, which may comprise, e.g., $MgF_2$, $LaF_3$, $Al_2O_3$, $SiO_2$ and/or $Na_5Al_3F_{14}$.

Moreover, the common illumination element, in particular the common condenser, can be displaceable in and/or counter to the direction of the focal area in order to achieve or set one of the aforementioned conditions (i) or (ii).

In particular, this can be advantageous when the common illumination element does not simultaneously enable the desired illumination of the structures of the lithography mask and the reflection of the radiation of the second optical unit under condition (i) or (ii). By displacing the common illumination element, it is possible to optimize either the illumination of the structures with the first beam path or the self-imaging of the focal area with the second beam path.

Optionally, it is possible in this case, e.g., by a color beam splitter or a movable mirror, to respectively fade out the "suboptimal" beam path.

It is furthermore conceivable for the reflection area to comprise an at least partly reflecting area which can be moved into the first beam path of the first optical unit and which can be retracted therefrom again.

Consequently, by moving in and retracting the partly reflecting area, it is possible, firstly, to add in or switch off the second beam path. At the same time, it is possible, depending on the magnitude of the transmissivity of the partly reflecting area for the radiation from the first optical unit, to fade out the first beam path completely, partly, or in a non-noticeable manner after moving in the partly reflecting area. An advantage of this option may be, furthermore, that the position at which the partly reflecting area is arranged after being moved in may be specifically adapted to imaging the focal area into itself by way of the second beam path, without this adversely affecting the adjustment of the first beam path.

Moreover, it is also conceivable for the reflection area to be embodied as part of an at least partly reflecting color beam splitter, which is arranged in the first beam path of the first optical unit and which preferably has a reflectivity of $R(VIS)>0.1$ in the visible spectral range and a transmissivity $T(UV)>0.8$ in the UV range.

Such a color beam splitter can likewise be positioned in such a way that the focal area is imaged to the best possible extent into itself by way of the second beam path by the at least partly reflecting area of said color beam splitter. Since the color beam splitter preferably reflects the visible light well but it is strongly transmissive for UV radiation, the second beam path of the second optical unit can therefore be optimized for self-imaging of the focal area when using visible light without adversely affecting the first beam path. As a result of this, the self-imaging of the focal area can be set particularly accurately in order to reduce the disadvantageous effects of the lack of depth of field during the edge detection.

In conclusion, what becomes clear from the optional embodiment possibilities discussed here is that the mask inspection system according to the invention offers the possibility of taking greater influence on the imaging properties of the second optical unit for the edge detection, while requiring a manageable amount of effort, than would be enabled by using a reflecting layer on the placement table. Therefore, the second optical unit can reduce the disadvantageous effects of the lack of depth of field during the edge detection, as a result of which a more accurate detection is made possible. Furthermore, the size of the lithography mask plays a subordinate role since the edge thereof can be moved into the beam path of the second optical unit by movement of the placement table.

The details of one or more embodiments of the invention are set forth in the accompanying drawings and the description below. Other features, objects, and advantages of the invention will be apparent from the description and drawings, and from the claims.

DESCRIPTION OF DRAWINGS

In the following detailed description, possible embodiments of the invention are described with reference to the following figures.

DETAILED DESCRIPTION

Possible embodiments of the present invention will be described in the following detailed description. However, it is emphasized that the present invention is not restricted to these embodiments. Rather, the configuration options described in relation to these specific embodiments can also, within the scope of the invention, be modified further and combined with one another in different ways and individual optional elements can also be omitted, provided these appear respectively disposable. In order to avoid redundancy, reference is made, in particular, to the explanations in the paragraphs above, which also remain valid for the detailed description now following below.

Figure 1:
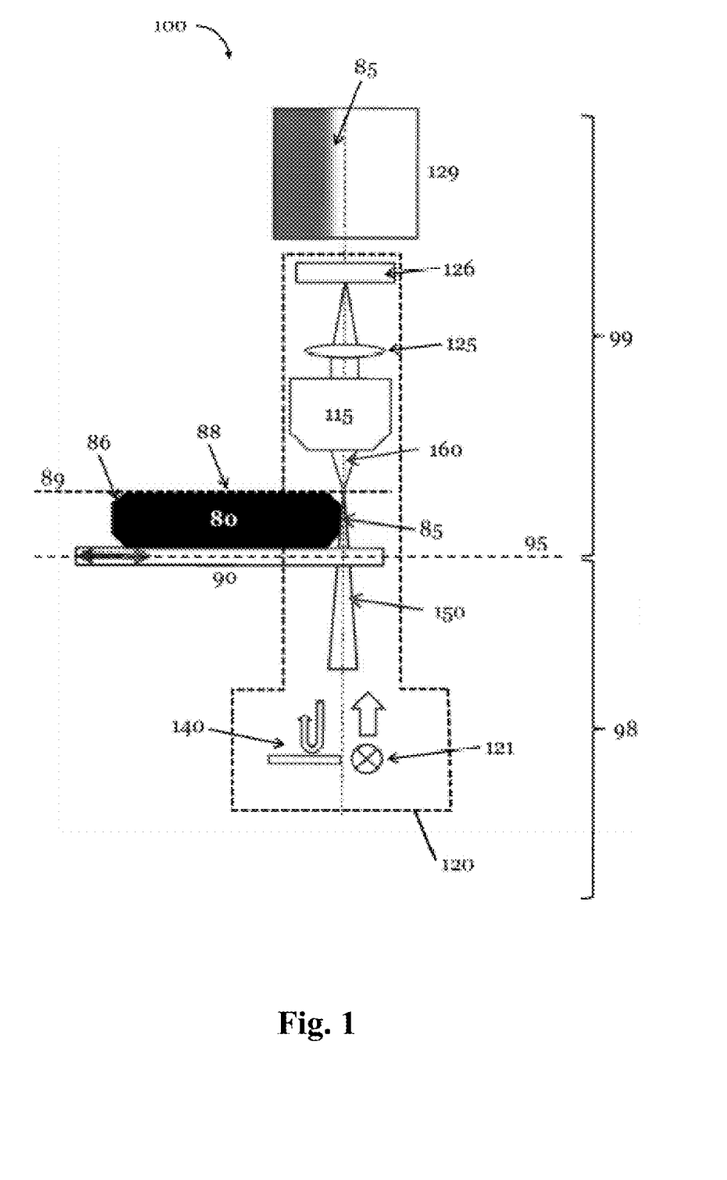
FIG. 1: An embodiment of a mask inspection system with a second optical unit for edge detection.

FIG. 1 shows an embodiment of a mask inspection system 100 according to the invention for inspecting or examining a lithography mask 80. The mask inspection system 100 has a placement table 90 for placing the lithography mask 80. Here, the placement table 90 is preferably displaceable in two independent directions within the plane 95 defined thereby and the movements of the placement table 90, and therefore of the lithography mask 80 placed thereon, can be registered by use of a measurement device (not shown here), for example by use of an interferometric measurement system.

The plane 95 defined by the placement table 90 subdivides the space into two half spaces 98 and 99. Here, the first half space 98 is that half space which is delimited by the plane 95 defined by the placement table 90 and in which the lithography mask 80 is not situated. By contrast, the second half space 99 is that half space which is delimited by the plane 95 defined by the placement table 90 and in which the lithography mask 80 is situated. Consequently, in the case of a horizontal arrangement of the placement table 90 and of the lithography mask 80, the first half space 98 corresponds to the lower half space and the second half space 99 corresponds to the upper half space and both half spaces are delimited from one another by the plane 95.

In general, the lithography mask 80 has a plurality of lateral edges 85, which by way of angled corners 86, so-called chamfers 86, merge into a surface 88 facing away from the placement table 90 and a surface of the lithography mask 80 facing the placement table 90. The mask inspection system 100 according to the invention enables an examination of structures of the lithography mask 80 such as marks, conductor tracks, etc. (not shown here) and an establishment of the position of at least one edge 85. Below, the latter is referred to as edge detection. Preferably, the position of at least two edges 85, connected to one another, of the lithography mask 80 can be established using the mask inspection system 100, e.g., by way of a corresponding displacement of the placement table 90.

For the purposes of examining the structures of the lithography mask 80, the mask inspection system 100 has a first optical unit with a first beam path. By way of example, the first optical unit can use radiation with a first wavelength in the UV range, in particular in the range from 193 nm to 365 nm.

Here, for the purposes of examining the structures, the lithography mask 80 is preferably placed onto the placement table 90 in such a way that the structures to be examined are arranged on or near the surface 88 of the lithography mask 80 facing away from the placement table 90, i.e., on or near that surface 88 of the lithography mask 80 facing an imaging optical unit of the first optical unit. By way of example, the imaging optical unit of the first optical unit can have a lens 115, which follows the lithography mask 80 in the first beam path. The surface 88 of the lithography mask 80 facing the lens 115 then defines a focal area 89 which substantially coincides with the surface 88 and onto which the imaging optical unit of the first optical unit can be focused (here, for example, substantially can mean to the extent that exact focusing is possible due to mechanical limits). By way of example, the lens 115 can be focused onto the focal area 89, as indicated in FIG. 1.

Here, the lens 115 preferably has a large numerical aperture (NA) (cf. FIG. 2B) in order to achieve a resolution that is as high as possible and in order to introduce an amount of light that is as large as possible into the imaging optical unit of the first optical unit for the purposes of examining the structures. Here, possible values are a numerical aperture greater than or equal to 0.4, preferably greater than or equal to 0.6. The numerical aperture of the lens (also referred to as imaging NA) in this case denotes the value $NA = n_0 * \sin \phi$, where $\phi$ is the half aperture angle of the largest possible light cone emerging from an axial point of the focal area 89 which can be registered by the lens 115 and $n_0$ is a refractive index of a medium which is arranged between the lens 115 and the focal area 89 or in which the lens 115 operates.

Except for the lens 115, the first optical unit is at first not discussed in any more detail within the scope of FIG. 1. The reason for this is that FIG. 1 should firstly, in principle, indicate two possible modes of operation of the mask inspection system 100 for edge detection, namely a transmitted-light mode and a reflected-light mode. For reasons of clarity, the illustration in FIG. 1 therefore concentrates mainly on the second optical unit 120 with a second beam path used for the edge detection. Further details in respect of the first optical unit follow within the scope of the discussion of the embodiments shown in FIGS. 2A and 2B and FIGS. 3A to 3D.

In both modes of operation, the second beam path of the second optical unit 120 passes through the plane 95 defined by the placement table 90 at least once. Here, the second optical unit 120 preferably uses radiation with a second wavelength, which differs from the first wavelength of the first optical unit. By way of example, the second optical unit 120 can use radiation with a second wavelength of between 300 nm and 800 nm, for example radiation with a second wavelength in the visible range.

In a transmitted-light mode (cf. FIGS. 2A and 2B), the second optical unit 120 first of all has an illumination optical unit for illuminating the edge 85 to be detected of the lithography mask 80. Proceeding from a light source 121 in the first half space 98, the edge 85 is in this case illuminated through the placement table 90.

Figure 2A:
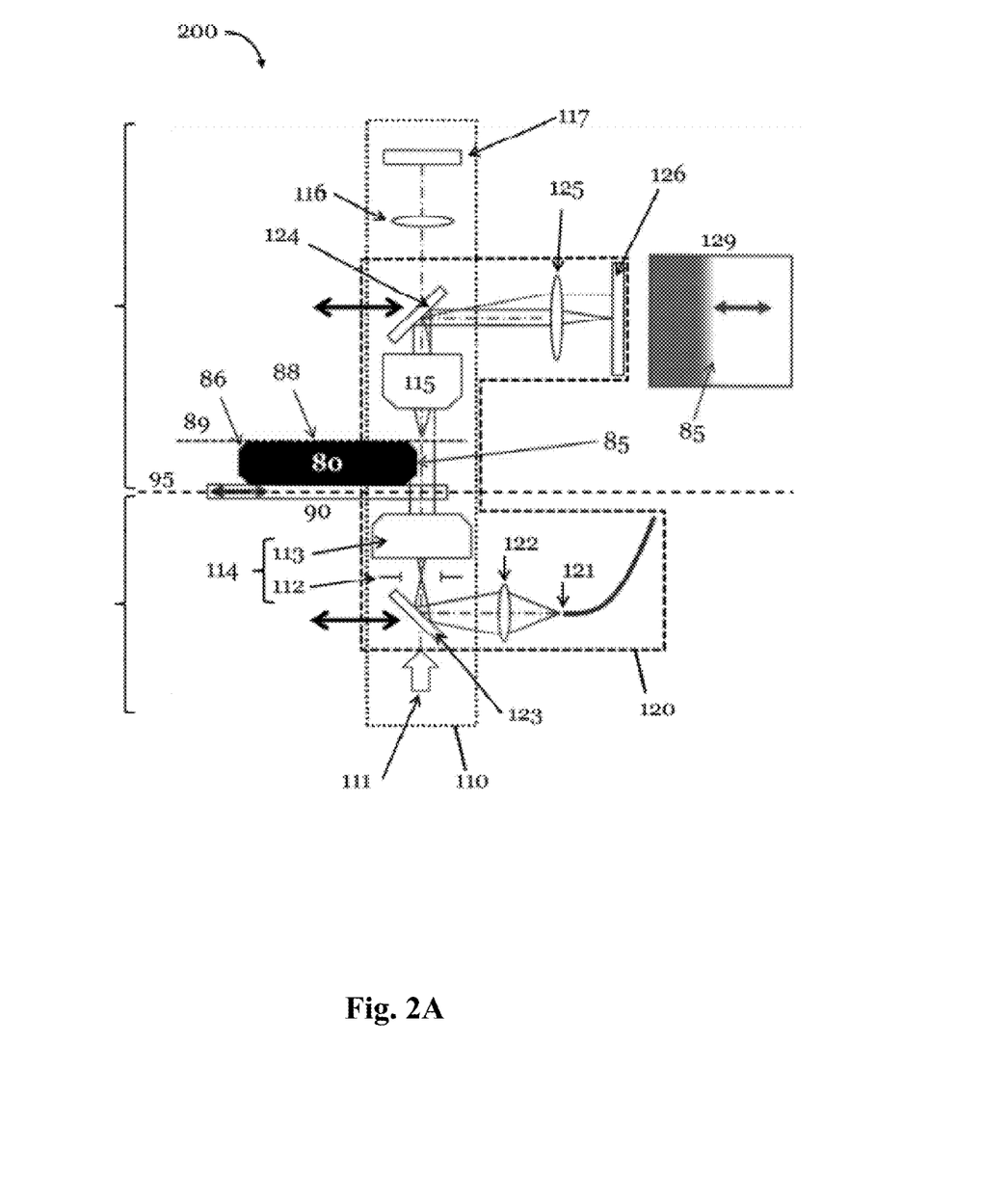
FIGS. 2A and 2B: An embodiment of a mask inspection system, in which the edge detection is carried out in the transmitted-light mode.
Figure 2B:
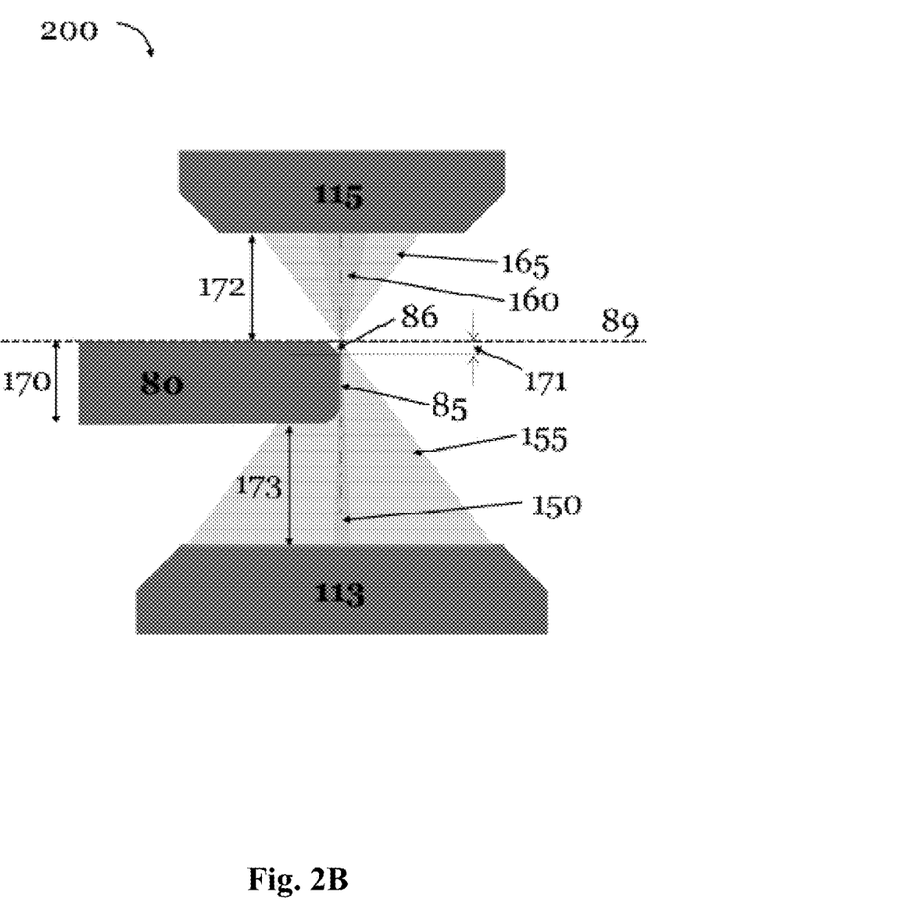

When reference is made to the illumination of the edge 85, this can mean, in particular, an illumination of the focal area 89 with preceding shadowing or reflecting of at least part of the light by the edge 85.

Thus, emanating from the first half space 98, the second beam path of the second optical unit 120 passes through the plane 95 defined by the placement table 90 once in this mode.

Here, the edge 85 is preferably illuminated by the illumination optical unit of the second optical unit 120 by way of a parallel illumination beam or an illumination beam 150 which converges towards the focal area 89. Here, the half aperture angle α of this illumination beam 150, e.g., satisfies the condition $n * \sin \alpha \leq 0.1$, for example $n * \sin \alpha = 0.06$. Here, n is once again a refractive index of a medium in this region of the second optical unit 120. Here, the expression $n * \sin \alpha$ is also referred to as illumination NA, analogous to the imaging NA $n_0 * \sin \phi$ of the lens 115 discussed above.

By way of example, the illumination optical unit of the second optical unit 120 has an illumination element which guides the second beam path to the focal area 89, as just described. By way of example, said illumination element can be a condenser. Here, this can preferably be a common illumination element of the first optical unit and of the second optical unit 120, for example a common condenser, which, in addition to illuminating the edge 85, also serves to illuminate the structures of the lithography mask 80 for the examination thereof.

As shown in FIG. 1, the lens 115 of the imaging optical unit of the first optical unit is furthermore preferably also used as part of the second optical unit 120 for establishing the position of the edge 85 of the lithography mask 80. Therefore, this can be a common lens 115 of the first optical unit and of the second optical unit 120. As explained above, this lens 115 is preferably focused onto a focal area 89, which substantially coincides with the surface 88 of the lithography mask 80.

The edge 85 may then lie outside of the depth of field of the lens 115. This disadvantageous effect for the edge detection can be softened by virtue of the edge 85, as described above, being illuminated by a parallel illumination beam 150 or an illumination beam converging toward the focal area 89, which allows a sharp shadow of the edge 80 to be cast into the focal area 89. In order to further soften the lack of depth of field of the lens 115, the numerical aperture of the common lens 115 (imaging NA) can furthermore be reduced during the edge detection (e.g., by a stop) compared to the numerical aperture used when examining the structures, for example from $NA \geq 0.6$ to $NA \approx 0.2$. As a result of this, the diameter of the light cone 160 registered during the edge detection by the lens 115 is reduced.

By contrast, in a reflected-light mode (cf. FIGS. 3A-3D), the second beam path of the second optical unit 120 emanates from the second half space 99 and first of all illuminates the edge 85 "from above". Thereupon, it passes through the plane 95 defined by the placement table 90 into the first half space 98, where it is reflected back at a reflection area of a reflection element 140. The second beam path once again passes through the plane 95 after the return reflection and illuminates the edge 85 "from below". From there, the second beam path continues into the imaging optical unit of the second optical unit 120.

Here too, a common lens 115 can again be part of the imaging optical unit of the second optical unit 120. Here, it is particularly advantageous if the reflection element 140 images the focal area 89 of the lens 115 into itself. Preferably, this is brought about approximately true to scale, for example with an imaging scale β in the region of $0.9 < |\beta| < 1.1$. Such self imaging of the focal area 89 true to scale can likewise help to minimize the influence of the lack of depth of field of the lens 115 in the region of the edge 85.

In both modes, the imaging optical unit of the second optical unit 120 is preferably configured in such a way that an image field with an extent of more than 100 μm in at least one direction is imaged. Preferably, the imaging optical unit of the second optical unit 120 can be used to image an image field comprising an area greater than 100 μm by 100 μm. This can accelerate and simplify the edge detection.

To this end, the imaging optical unit of the second optical unit for example has a tube optical unit 125, which is connected between the lens 115 and a (CCD) camera 126, within which the second beam path ends and which is used for evaluation purposes. By way of example, the tube optical unit 125 can consist of one or more optical elements such as lens elements, stops, mirrors or beam splitters.

Here, the magnification of the imaging optical unit of the second optical unit 120 can be set as desired by a suitable arrangement of these optical elements, without needing to change the position of the lens 115.

The image 129 recorded in the camera 126 is likewise indicated in FIG. 1. It is possible to see that the edge 85 is not imaged completely in focus in the image 129 due to the lack of depth of field of the lens 115 in the region of the edge 85. However, a certain amount of unsharpness is acceptable since an accuracy of ≈10 μm is sufficient for the edge detection.

As already mentioned previously, additional features, such as, e.g., a suitable image evaluation, can furthermore render it possible, in principle, to also achieve an accuracy of, e.g., 10 μm when determining the position of the edge 85 when the unsharpness in the image 129 of the edge 85 first of all corresponds to a larger unsharpness in the position of the edge 85. Thus, for example, in the case of an unsharpness in the image 129 of the edge 85, which corresponds to an unsharpness in the position of the edge 85 of 100 μm, it may be possible nevertheless by use of a suitable evaluation of the image 129 to achieve a final accuracy corresponding to an unsharpness in the detected position of the edge 85 of only 10 μm. Such optional evaluation methods can further support the improvement in the accuracy of the edge detection.

FIGS. 2A and 2B show a special embodiment of a mask inspection system 200 according to the invention which operates in the transmitted-light mode. Here, functionally equivalent or similar elements are denoted by the same reference sign as in FIG. 1 in order to make the relationship clear. Therefore, in order to avoid redundancy, reference is made to the explanations in relation to FIG. 1, which also remain applicable here, and only a few special features of the embodiment 200 are explained in detail. The same applies to the exemplary embodiments shown in FIGS. 3A to 3D.

Furthermore, reference is explicitly made to the fact that the exemplary embodiment 200 shown here is merely a specific embodiment option and that a mask inspection system in the transmitted-light mode according to the invention can also have a different design and, in particular, that the mechanical and optical elements described here can also have a different arrangement. Analogous statements likewise apply to the embodiments in FIGS. 3A to 3D.

FIG. 2A first of all shows the first optical unit 110 with a first beam path explicitly. Emanating from a radiation source 111, for example a UV radiation source, in the first half space 98, the first beam path first of all passes through an illumination optical unit of the first optical unit 110, which enables the illumination of the structures to be examined through the plane 95 and through the lithography mask 80. In the present case, this illumination optical unit has a stop 112 and a lens-element system 113. Together, these form an illumination element, which is configured as a condenser 114, for guiding as much radiation emitted by the source 111 as possible onto the structures of the lithography mask 80 and, from there, into the imaging optical unit of the first optical unit 110.

The imaging optical unit of the first optical unit 110 has a lens 115, which, as already mentioned previously, preferably has NA≥0.4 or even NA≥0.6. Moreover, the imaging optical unit of the first optical unit 110 comprises a tube optical unit 116 and a (CCD) camera 117, in which the first beam path ends and which is used to examine the structures of the lithography mask 80.

In the present case, the light source 121 for the second beam path of the second optical unit 120 is given by the end of an optical waveguide. By way of a converging lens element 122 and a movable mirror 123, which can be moved into and retracted from the first beam path, this end of the optical waveguide is imaged by the second optical unit 120 into the plane of the stop 112 of the condenser 114, the latter likewise acting as an illumination element within the scope of the second optical unit 120. The common condenser 114 in this case serves both as illumination element within the scope of the illumination optical unit of the first optical unit 110 and as illumination element within the scope of the illumination optical unit of the second optical unit 120. Therefore, the illumination optical units of the first optical unit 110 and the second optical unit 120 coincide at least in part in the present case, but do not coincide completely.

The end of the optical waveguide can have a virtually punctiform embodiment. Since the end can likewise be imaged in a virtually punctiform manner into the stop plane of the stop 112 of the condenser 114 by the converging lens element 122 and the mirror 123 in the case of a suitable magnification of the imaging, the condenser 114 can enable an illumination of the edge 85 of the lithography mask 80 with an illumination beam 150 which has a parallel configuration or a configuration converging toward the focal area 89 with a small half aperture angle.

In the embodiment 200 shown here, the lens 115 is both part of the imaging optical unit of the first optical unit 110 and part of the imaging optical unit of the second optical unit 120, namely as a common lens 115. The imaging optical unit of the second optical unit 120 moreover comprises a further movable mirror 124, which can likewise be moved into and retracted from the first beam path of the first optical unit 110, a tube optical unit 125 and a (CCD) camera 126.

Therefore, a switch can be made between examining the structures of the lithography mask 80 and the edge detection by inward movement and retraction of the mirrors 123 and 124. Alternatively, the mirrors 123 and 124 could, for example, also have a semi-transmissive configuration, particularly with a large enough transmissivity for the radiation with the first wavelength, or these could be color beam splitters in order thus to enable a dual operating mode. Particularly in the two last-mentioned cases, the advantage once again appears if the first wavelength differs from the second one.

FIG. 2B shows a magnified illustration of the mask inspection system 200 in the region of the lens-element system 113 of the condenser 114 and of the lens 115. Here, for a change, exemplary dimensions of the mask 80 and specifications in relation to the arrangement thereof between illumination optical unit and imaging optical unit are specified, as may be encountered when using the mask inspection system 200. However, it is emphasized that these are only exemplary values which cannot restrict the invention.

By way of example, the mask 80 can have a thickness 170 of the order of 6.35 mm and the chamfer 86 can have a height 171 of the order of 0.8 mm. The distance 172 from the mask 80 to the lens 115 can be of the order of 8 mm and the distance 173 to the lens-element system 113 of the condenser 114 can be of the order of 9 mm.

FIG. 2B moreover shows how the lens-element system 113 of the condenser 114 and the lens 115 can be used when examining the structures of the mask 80 and when detecting the edge 85 of the mask 80.

When examining the structures of the mask 80, the illumination—e.g., using UV radiation—can be realized through the lens-element system 113 of the condenser 114 using the largest possible light cone 155 which can be cast by the lens-element system 113 onto the structures of the mask 80 in order thus to achieve a high illumination intensity. The half aperture angle $\alpha$ (the half aperture angle is the angle between the optical axis of the system and the outermost boundary of the light cone/beam) of the illumination light cone 155 in this case for example satisfies the condition $n*\sin \alpha \approx 0.6$. Here, n is the refractive index of the medium between the lens-element system 113 and the mask 80 or of the medium, in which the lens-element system 113 operates (i.e., the illumination NA can be, e.g., $\approx 0.6$).

In this case, the numerical aperture of the lens 115 (imaging NA), i.e., the value $n_0*\sin \phi$, is also selected to be as large as possible in order to achieve a high light intensity of the imaging and a resolution of the structures of the mask 80 which is as precise as possible. By way of example, $n_0*\sin \phi \approx 0.6$ (i.e., the imaging NA can be, e.g., $\approx 0.6$) in this case too. Here, no is the refractive index of the medium between the lens 115 and the mask 80 or of the medium, in which the lens 115 operates. $\phi$ is the half aperture angle of the imaging light cone 165 captured by the lens.

In one embodiment, the whole mask inspection system 200 is moreover flooded by circulating air, such that $n \approx n_0 \approx 1$ applies.

By contrast, as already mentioned, the edge 85 is preferably illuminated by an illumination beam 150 which is parallel or, as shown here, converges to the focal area 89 when detecting the edge 85. Here, the illumination beam 150 preferably has a very small half aperture angle $\alpha$. By way of example, a half aperture angle $\alpha$ with $n*\sin \alpha \leq 0.1$ (i.e., an illumination NA$\leq 0.1$) is conceivable. In one embodiment, the angle $\alpha$ meets the condition $n*\sin \alpha \approx 0.06$ (i.e., an illumination NA$\approx 0.06$). Such a small aperture angle can be achieved, for example, by imaging the end of the optical waveguide into the plane of the stop 112 of the condenser 114, as already described above. Additionally or alternatively, the illumination beam 150 could also be constricted by an additional stop (not shown here). Such additional masking can for example take place in a stop plane in the condenser 114, e.g., in the plane of the stop 112, or in a plane conjugate thereto.

The numerical aperture of the lens 115 (imaging NA) can also be reduced during the edge detection in order to increase the depth of field of the imaging of the edge image. By way of example, this can be brought about with the aid of a stop (not shown here). This masking can, for example, take place in a stop plane in the lens 115 or in a plane conjugate thereto. By way of example, it is conceivable that the numerical aperture NA=$n_0*\sin \phi$ of the lens is reduced to NA$\approx 0.2$ (i.e., to an imaging NA$\approx 0.2$) during edge detection. This may constitute a good compromise between depth of field and light intensity when imaging the edge image.

Figure 3A:
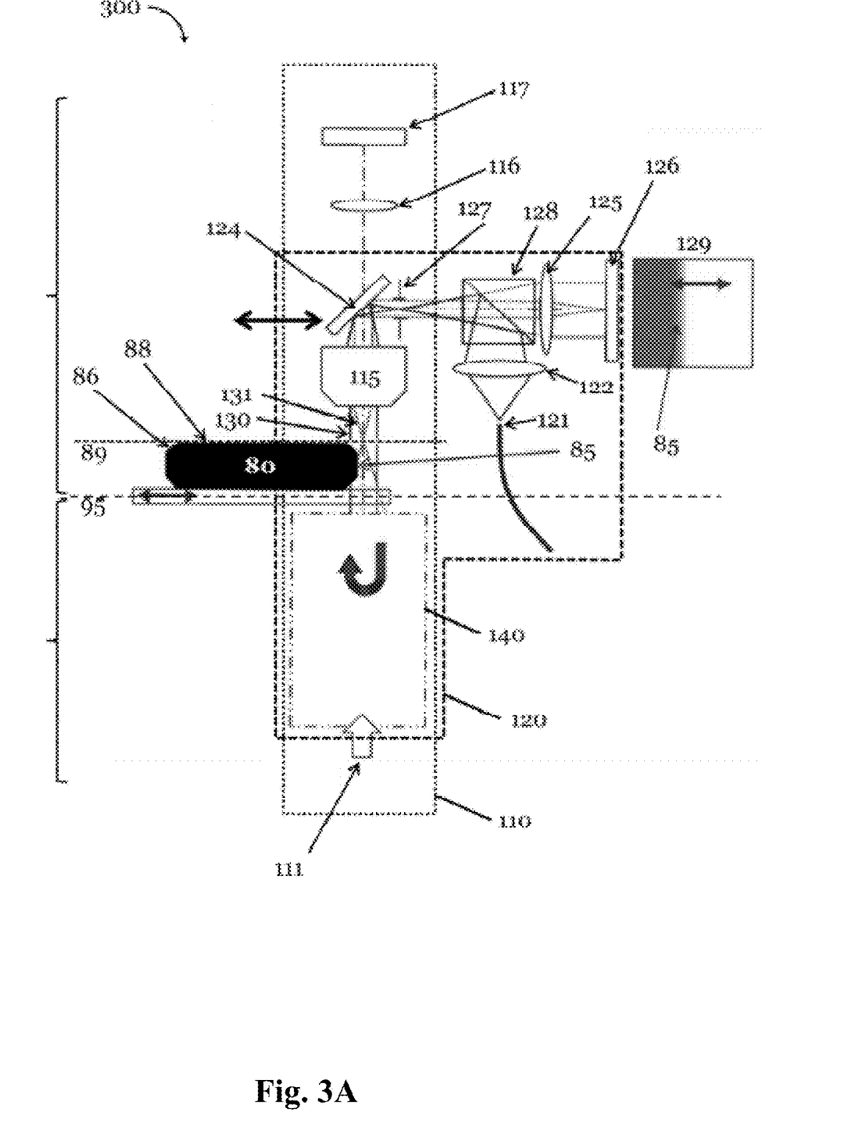
FIGS. 3A to 3D: An embodiment of a mask inspection system comprising a reflection element, in which the edge detection is carried out in the reflected-light mode, and possible embodiments of a reflection element.
Figure 3B:
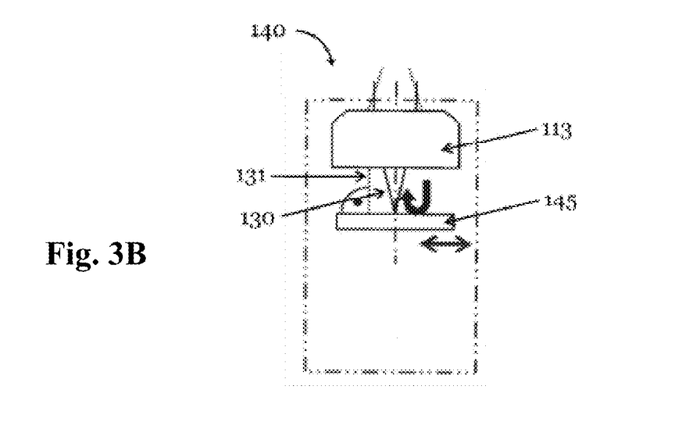
Figure 3C:
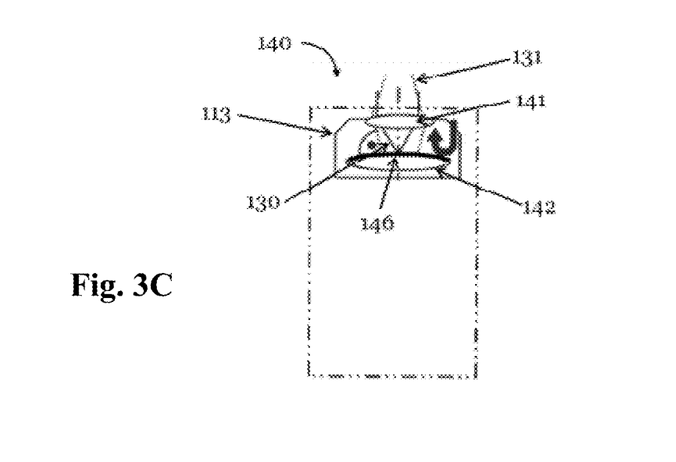
Figure 3D:
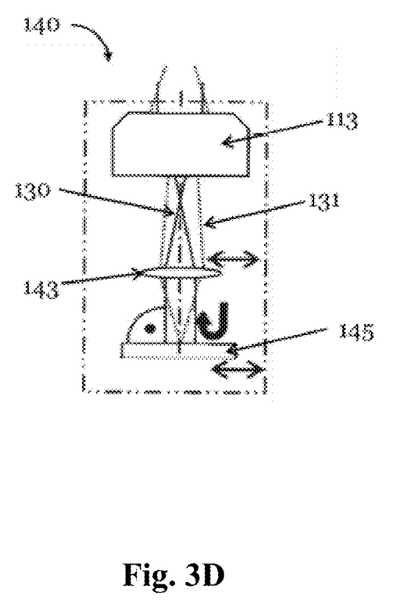

FIG. 3A finally shows a special embodiment of a mask inspection system 300 according to the invention, which operates in the reflected-light mode. FIGS. 3B to 3D show possible embodiments of a reflection element 140 used in this case.

First of all, there are no large differences to the embodiment 200 in relation to the first beam path of the first optical unit 110. Merely the illumination optical unit of the first optical unit 110 may have a different configuration. It is first of all possible that the illumination optical unit of the first optical unit 110 in this case forms a completely separate illumination system (not shown here) from the illumination optical unit of the second optical unit 120. By way of example, the illumination optical unit with the light source 111 and the condenser 114, shown in FIG. 2A, could be used separately. However, it is also possible that the reflection element 140, which serves for the return reflection of the second beam path to illuminate the edge 85 "from below," also at least partly acts as part of the illumination optical unit of the first optical unit 110. This possibility will once again be considered in more detail in the discussion relating to FIGS. 3B to 3D.

In the present case, the second beam path of the second optical unit 120 emanates from the radiation source 121, formed by the end of an optical waveguide, in the second half space 99. From there, the second beam path extends through a converging lens element 122 and a beam splitter 128, and also through a stop 127. From there, it is guided to the edge 85 of the lithography mask 80 by way of a movable mirror 124, which can be moved into the first beam path and retracted therefrom, and by way of a common lens 115 of the first optical unit 110 and of the second optical unit 120.

Thereupon, the second beam path passes into the first half space 98 through the plane 95 defined by the placement table 90. In the first half space 98, the second beam path is reflected by a reflection area of the reflection element 140, once again passes through the plane 95 defined by the placement table 90, this time in the direction of the second half space 99, and, there, once again illuminates the edge 85 to be detected of the lithography mask 80 (to the extent that this is positioned correctly into the second beam path). Then, by way of the common lens 115 and the movable mirror 124, the second beam path once again extends through the stop 127 and is imaged (at least in part), in a (CCD) camera 126 via a tube optical unit 125 by use of the beam splitter 128.

In order to soften disadvantageous effects of the lack of depth of field of the lens 115 in the region of the edge 85, which may be caused by virtue of the fact that the lens 115 is focused on the focal area 89 which substantially coincides with the surface 88 of the mask 80, the reflection element 140 is preferably embodied in this case in such a way that it images the focal area 89 into itself, in a manner which is as true to scale as possible (e.g., with $0.9<|\beta|<1.1$).

FIGS. 3B to 3D show three embodiments of a reflection element 140 which render this possible. Here, first of all, it is to be noted that the stop 127, which is part of the second optical unit 120, defines at least one chief ray 130 which passes through the stop 127 in the center thereof. Moreover, the stop 127 defines at least one marginal ray 131, which passes through the stop 127 at the edge thereof.

Here, FIG. 3B shows one option of how a self-image of the focal area 89 which is as true to scale as possible can be achieved. The embodiment of a reflection element 140 shown in FIG. 3B has a condenser with a lens-element system 113, e.g., a common condenser 114, and a reflection area 145, which comprises an at least partly reflecting area that can be moved into the beam path of the first optical unit 110 and be retracted therefrom again. By way of example, a movable mirror could be used therefor. After being moved into the first beam path, the lens-element system 113 (and optionally further parts of the condenser) and the reflection area 145 are arranged in the second beam path in such a way that the chief ray height of each chief ray 130 (i.e., the distance between the point of incidence of the chief ray 130 and the center of the reflection area 145) is 0, while all marginal rays 131 are substantially perpendicular to the reflection area 145. Here, substantially can mean to the extent that this is permitted by the production of the reflection area 145 and/or the control of the beam path.

Therefore, by moving in the reflection area 145 and retracting it again, the condenser with the lens-element system 113 can be blocked or made available for the first beam path, and so it is possible to switch between examining the structures and the edge detection. This also means that there is no need for a dedicated condenser for the first illumination system of the first optical unit 110. Thus, for example, use can be made of a common condenser 114.

Preferably, the movable mirror 124 is also moved into the first beam path and retracted therefrom simultaneously with the reflection area 145 being moved in and retracted again. Or the two optical elements 145 and 124 are at least partly transmissive to the radiation of the first optical unit 110. Then, inward movement can add on the edge detection, without interrupting the examination of the structures.

FIG. 3C shows another embodiment of a reflection element 140, in which the chief ray height of the chief rays 130 equals 0 and the marginal rays 131 are substantially perpendicular to a reflection area 146. However, the reflection area 146 is provided here by an at least partly reflecting area within the lens-element system 113 of a condenser, for example of the condenser 114, which may also act as illumination element within the scope of the illumination optical unit of the first optical unit 110. More precisely, the reflection area 146 is a partly reflecting surface of a converging lens element 142, which may form the condenser together with a (non-reflecting) second converging lens element 141 and optional further optical elements (not shown here).

In order to achieve this partial reflection capability, the converging lens element 142 may, for example, be coated in the region of the reflection area 146 by a material which increases a reflectivity of the surface of the lens element 142 in the visible spectral range (or, in general, in the spectral range used by the second optical unit 120). Conceivable materials for this purpose have already been specified above. Moreover, the whole condenser can be displaceable in and/or counter to the direction of the focal area 89. This can render it possible, firstly, to position the reflection area 146 in an ideal manner in the second beam path during the edge detection and, secondly, to arrange the condenser in the first beam path for ideal illumination of the structures when examining the mask structures.

FIG. 3D finally shows a further possible embodiment of a reflection element 140. This once again comprises a condenser with a lens-element system 113 and a reflection area 145, which has an at least partly reflecting area, for example a movable mirror, that can be moved into the first beam path and retracted therefrom. Furthermore, the embodiment in FIG. 3D has an additional converging lens element 143, however. The lens element 143 can also be moved into the first beam path and retracted therefrom and this can, for example, be brought about simultaneously with the moving in and retraction of the reflection area 145. This additional lens element 143 and the arrangement of the optical elements in the embodiment of FIG. 3D now ensure that the marginal ray height of the marginal rays 131 equals 0 on the reflection area 145, while the chief rays 130 are (substantially) perpendicular to the reflection area 145.

As an alternative or in addition to the embodiments shown here, it is also possible that the reflection area of a reflection element 140 is embodied as part of an at least partly reflecting color beam splitter, which is arranged in the first beam path of the first optical unit 110 and which preferably has a reflectivity of $R(VIS)>0.1$ in the visible spectral range and a transmissivity $T(UV)>0.8$ in the UV range.

What is claimed is:

1. A mask inspection system for inspecting lithography masks, comprising:
    a. a placement table for placing a lithography mask to be inspected;
    b. a first optical unit with a first beam path for examining structures of the lithography mask; and
    c. a second optical unit with a second beam path for establishing a position of at least one edge of the lithography mask;
    d. wherein the second beam path of the second optical unit passes at least once through a plane defined by the placement table, and
    e. wherein the first optical unit and the second optical unit have at least one common optical element.

2. The mask inspection system according to claim 1, wherein the first optical unit uses radiation with a first wavelength in the range from 193 nm to 365 nm.

3. The mask inspection system according to claim 1, wherein the second optical unit uses radiation with a second wavelength, which differs from the first wavelength.

4. The mask inspection system according to claim 1, wherein the second optical unit uses radiation with a second wavelength in the range from 300 nm to 800 nm.

5. The mask inspection system according to claim 1, wherein the second optical unit images an image field with an extent of more than 100 µm in at least one direction.

6. The mask inspection system according to claim 1, wherein the common optical element comprises a common lens with a numerical aperture $NA \geq 0.6$.

7. The mask inspection system according to the claim 6, wherein the common lens is focused onto a focal area which substantially coincides with a surface of the lithography mask facing the lens.

8. The mask inspection system according to claim 1, wherein the common optical element comprises a common illumination element, which enables the illumination of the structures of the lithography mask for the examination thereof and the illumination of the edge for establishing the position of the edge.

9. The mask inspection system according to claim 8, wherein the common illumination element comprises a common condenser.

10. The mask inspection system according to claim 1, wherein the second beam path of the second optical unit emanates from a first half space, which is delimited by the plane defined by the placement table and in which the lithography mask is not situated, and passes through the plane from there.

11. The mask inspection system according to claim 1, wherein a light source for the second optical unit comprises an end of an optical waveguide.

12. The mask inspection system according to claim 1, wherein the second optical unit comprises an illumination optical unit for illuminating the edge of the lithography mask and wherein the illumination of the edge is implemented by a parallel or converging illumination beam, which has a half aperture angle $\alpha$ with $n*\sin \alpha \leq 0.1$, where n represents a refractive index of a medium between the illumination optical unit and the edge.

13. The mask inspection system according to claim 12, wherein the illumination optical unit comprises a common condenser that is common to both the first optical unit and the second optical unit.

14. The mask inspection system according to claim 13, wherein the illumination optical unit images an end of an optical waveguide into a plane of a stop of the common condenser.

15. The mask inspection system according to claim 1, comprising at least one color beam splitter and/or a movable mirror.

16. The mask inspection system according to claim 1, wherein the second beam path of the second optical unit emanates from a second half space, which is delimited by the plane defined by the placement table and in which the lithography mask is situated, passes through the plane and is subsequently reflected back at a reflection area of a reflection element in a first half space, which is likewise delimited by the plane and in which the lithography mask is not situated.

17. The mask inspection system according to claim 16, wherein the reflection element images the focal area of a common lens onto itself with an imaging scale β with 0.9<β<1.1.

18. The mask inspection system according to claim 16, wherein the second optical unit comprises an aperture stop, which defines at least one chief ray and at least one marginal ray, and wherein the reflection element is arranged in the second beam path of the second optical unit in such a way that (i) a chief ray height at the reflection area is equal to 0 and the marginal ray is substantially perpendicular to the reflection area or (ii) the chief ray is substantially perpendicular to the reflection area and a marginal ray height at the reflection area is equal to 0.

19. The mask inspection system according to claim 16, wherein the reflection area comprises an at least partly reflecting area of a lens-element system of a common condenser.

20. The mask inspection system according to claim 19, wherein the at least partly reflecting area of the lens-element system of the common condenser has a coating for increasing a reflectivity of the at least partly reflecting area in the visible spectral range.

21. The mask inspection system according to claim 19, wherein the second optical unit comprises an aperture stop, which defines at least one chief ray and at least one marginal ray, and wherein the reflection element is arranged in the second beam path of the second optical unit in such a way that (i) a chief ray height at the reflection area is equal to 0 and the marginal ray is substantially perpendicular to the reflection area or (ii) the chief ray is substantially perpendicular to the reflection area and a marginal ray height at the reflection area is equal to 0;
wherein the common condenser is displaceable in and/or counter to the direction of the focal area in order to achieve one of the aforementioned condition (i) or (ii).

22. The mask inspection system according to claim 16, wherein the reflection area comprises an at least partly reflecting area which can be moved into the first beam path of the first optical unit and which can be retracted therefrom again.

23. The mask inspection system according to claim 16, wherein the reflection area is embodied as part of an at least partly reflecting color beam splitter, which is arranged in the first beam path of the first optical unit and which has a reflectivity of R(VIS)>0.1 in the visible spectral range and a transmissivity T(UV)>0.8 in the UV range.

24. A mask inspection system for inspecting lithography masks, comprising:
a placement table for placing a lithography mask to be inspected;
a first optical unit with a first beam path for examining structures of the lithography mask; and
a second optical unit with a second beam path for establishing a position of at least one edge of the lithography mask;
wherein the second beam path of the second optical unit passes at least once through a plane defined by the placement table, and
wherein the second beam path of the second optical unit emanates from a second half space, which is delimited by the plane defined by the placement table and in which the lithography mask is situated, passes through the plane and is subsequently reflected back at a reflection area of a reflection element in a first half space, which is likewise delimited by the plane and in which the lithography mask is not situated.

25. The mask inspection system according to claim 24, wherein the reflection element images the focal area of a common lens onto itself with an imaging scale β with 0.9<|β|<1.1.

26. The mask inspection system according to claim 24, wherein the second optical unit comprises an aperture stop, which defines at least one chief ray and at least one marginal ray, and wherein the reflection element is arranged in the second beam path of the second optical unit in such a way that (i) a chief ray height at the reflection area is equal to 0 and the marginal ray is substantially perpendicular to the reflection area or (ii) the chief ray is substantially perpendicular to the reflection area and a marginal ray height at the reflection area is equal to 0.

27. The mask inspection system according to claim 24, wherein the reflection area comprises an at least partly reflecting area of a lens-element system of a common condenser.

28. The mask inspection system according to claim 27, wherein the at least partly reflecting area of the lens-element system of the common condenser has a coating for increasing a reflectivity of the at least partly reflecting area in the visible spectral range.

29. The mask inspection system according to claim 27, wherein the second optical unit comprises an aperture stop, which defines at least one chief ray and at least one marginal ray, and wherein the reflection element is arranged in the second beam path of the second optical unit in such a way that (i) a chief ray height at the reflection area is equal to 0 and the marginal ray is substantially perpendicular to the reflection area or (ii) the chief ray is substantially perpendicular to the reflection area and a marginal ray height at the reflection area is equal to 0;
wherein the common condenser is displaceable in and/or counter to the direction of the focal area in order to achieve one of the aforementioned condition (i) or (ii).

30. The mask inspection system according to claim 24, wherein the reflection area comprises an at least partly reflecting area which can be moved into the first beam path of the first optical unit and which can be retracted therefrom again.

31. The mask inspection system according to claim 24, wherein the reflection area is embodied as part of an at least partly reflecting color beam splitter, which is arranged in the first beam path of the first optical unit and which has a reflectivity of R(VIS)>0.1 in the visible spectral range and a transmissivity T(UV)>0.8 in the UV range.

* * * * *

UNITED STATES PATENT AND TRADEMARK OFFICE
CERTIFICATE OF CORRECTION

PATENT NO. : 10,054,426 B2
APPLICATION NO. : 14/920933
DATED : August 21, 2018
INVENTOR(S) : Jochen Hetzler et al.

It is certified that error appears in the above-identified patent and that said Letters Patent is hereby corrected as shown below:

Column 19
Line 24, in Claim 17, delete "$0.9 < \beta < 1.1$." and insert -- $0.9 < |\beta| < 1.1$. --

Signed and Sealed this
Sixteenth Day of October, 2018

Andrei Iancu
*Director of the United States Patent and Trademark Office*